(12) United States Patent
Brodsky et al.

(10) Patent No.: US 7,354,779 B2
(45) Date of Patent: Apr. 8, 2008

(54) TOPOGRAPHY COMPENSATED FILM APPLICATION METHODS

(75) Inventors: Colin J. Brodsky, Salt Point, NY (US); Scott J. Bukofsky, Hopewell Junction, NY (US); Allen H. Gabor, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 11/276,707

(22) Filed: Mar. 10, 2006

(65) Prior Publication Data

US 2007/0249070 A1 Oct. 25, 2007

(51) Int. Cl.
*G01R 31/26* (2006.01)
*H01L 21/66* (2006.01)

(52) U.S. Cl. .................. 438/16; 438/781; 438/323; 438/790

(58) Field of Classification Search .................. 438/16, 438/781, 321–330, 790
See application file for complete search history.

(56) References Cited

U.S. PATENT DOCUMENTS

| | | | |
|---|---|---|---|
| 5,991,081 A * | 11/1999 | Haaland et al. ............. | 359/589 |
| 6,172,812 B1 * | 1/2001 | Haaland et al. ............. | 359/589 |
| 6,641,971 B2 * | 11/2003 | Huang et al. ............... | 430/189 |
| 6,716,767 B2 * | 4/2004 | Shih et al. .................. | 438/760 |
| 6,900,000 B2 * | 5/2005 | Sabnis et al. ............... | 430/322 |
| 7,132,219 B2 * | 11/2006 | Sabnis et al. ............. | 430/271.1 |
| 7,229,936 B2 * | 6/2007 | Brodsky et al. ............ | 438/790 |
| 2003/0129542 A1 * | 7/2003 | Shih et al. .................. | 430/311 |
| 2003/0203311 A1 * | 10/2003 | Dobisz et al. ........... | 430/275.1 |
| 2006/0073620 A1 * | 4/2006 | Shieh et al. .................. | 438/16 |

* cited by examiner

*Primary Examiner*—Zandra V. Smith
*Assistant Examiner*—Telly D Green
(74) *Attorney, Agent, or Firm*—Yuanmin Cai; Hoffman, Warnick & D'Alessandro LLC

(57) ABSTRACT

Methods for applying topographically compensated film in a semiconductor wafer fabrication process are disclosed. The processes include premapping a surface of a wafer so as to determine the local topography (e.g., z-height) of the wafer and then applying a variable depth of a film to the wafer, such that the variable depth is modulated based on the local topography of the wafer. The resultant topography of the applied film and wafer is substantially planar (e.g., within approximately 100 nm) across the wafer.

15 Claims, 6 Drawing Sheets

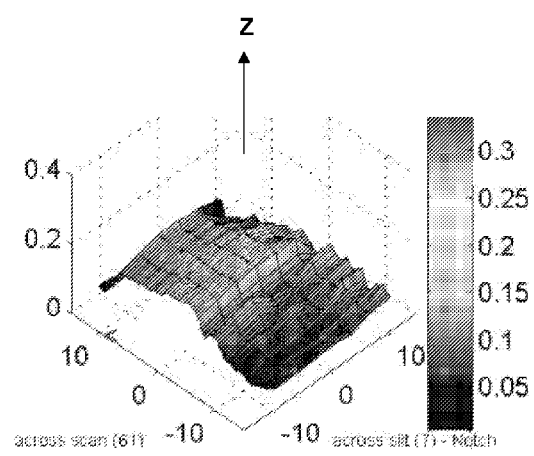
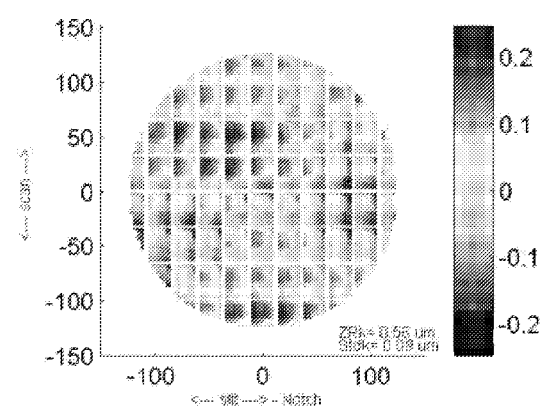
FIG. 1A
FIG. 1B

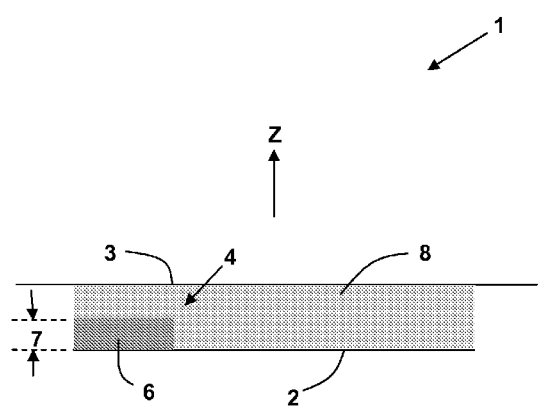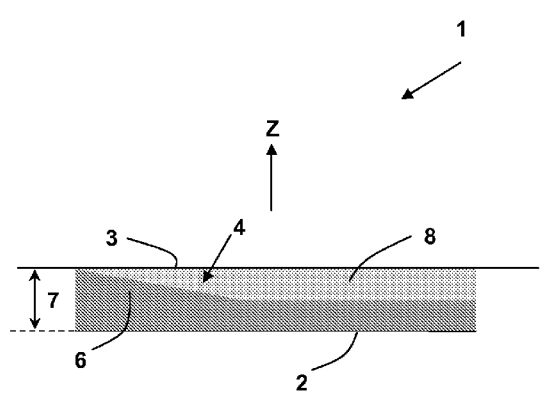
FIG. 4A
FIG. 4B

TOPOGRAPHY COMPENSATED FILM APPLICATION METHODS

BACKGROUND OF THE INVENTION

1. Field of the Invention

The present invention relates generally to semiconductor wafer fabrication and the photolithographic imaging portion thereof. More specifically, the present invention provides for film application methods that compensate for topography of the wafer.

2. Background Art

In the field of semiconductor wafer fabrication, photolithographic imaging on a wafer is highly dependent on the uniformity of the substrate. More specifically, current lithography processes are hindered because across-chip topography typically consumes the entire process depth of focus available in current equipment. Further, often induced by chemical mechanical planarization (CMP) processing, step heights (e.g., distance(s) in a z-direction between high and low point(s) across a chip) can increase in magnitude within an exposure field through each subsequent processing step. These step heights are often observed between static random access memory (SRAM) arrays and random logic and/or between kerf and product. As a result, length scales (e.g., horizontal distance) between regions that are higher and lower than the wafer's nominal height can be on the order of 1 mm. Further, because the chemical vapor deposition (CVD) or spin-on films applied at many levels do not planarize the substrate on a large proportion length scale, the topography is not reduced (i.e., improved) before lithography step(s). Consequently, because the spin-on bottom antireflective coating (BARC) and resist layers also can not planarize a substrate on a range of a millimeter. There are significantly different Z-positions relative to the substrate and no common focal plan at many levels, especially in the back end of line processes (BEOL). Furthermore, with increasingly high numerical aperture (NA), theoretical optical depth of focus is sacrificed for increased resolution, further exacerbating these shortcomings.

Topographical variations across a chip on a wafer can have different characteristic length scales of variation. Planarizing over underlying patterns may be problematic. Consider the example of coating a film on a wafer after performing silicon on insulator (SOI) patterning and etch. At this stage, the wafer might typically have millions of shapes in each die with a small variation in topographical height in between these shapes. In order to improve coating uniformity, one might have to address the magnitude of around 10 perturbations along a 1 micron length as one moves horizontally along the die. Applying a sufficiently thick resist and spin coating can easily planarize a variation of this magnitude and degree.

Contrastingly, where the horizontal distance between peaks and troughs in die (or wafer), topography is greater (i.e., long length scale of variation). An example may be a single die having two areas with SRAM arrays that end up 100 nm higher than surrounding lower density patterning. In this type of scenario, the aforementioned spin coating is ineffective at planarizing the surface of the die because the film essentially starts following the contours of topographical variation rather than simply planarizing the surface, as would be desired.

Currently, various ways to address these shortcomings include either improving the overall process latitude, or fixing CMP rate irregularities that are prone to induce step heights with varying pattern densities. Unfortunately, the aforementioned approaches are both costly and time consuming. In some cases, a solution does not exist and a chip must be redesigned, requiring an entire new reticle set, with complete restart of the product.

In view of the foregoing, there exists a need for methods for providing improved preparation for photolithography that compensates for wafer topography that is both simple, in time and cost, and does not sacrifice throughput.

SUMMARY OF THE INVENTION

Film application methods that compensate for topography are disclosed. The methods include premapping a surface of a wafer so as to determine the local topography (e.g., z-height) of the wafer and then applying a variable depth of a film to the wafer, such that the variable depth is modulated based on the local topography of the wafer. The resultant topography of the applied film and wafer is substantially planar (e.g., within approximately 100 nm) across the wafer.

A first aspect of the present invention provides a method of applying topographically compensated film, comprising the steps of: premapping a surface of a wafer, wherein a local topography of the wafer is determined; and applying a variable depth of a film to the wafer, wherein the variable depth is modulated based on the local topography.

A second aspect of the present invention provides a method comprising: determining a topography of an upper surface of a semiconductor wafer; and applying a film having a variable thickness to the upper surface of the wafer, wherein the variable thickness is based upon the topography, so that a resultant topography of the film on the wafer is substantially planar.

A third aspect of the present invention provides a method comprising: providing a wafer configured for semiconductor fabrication; determining a topography of a chip on the wafer, wherein the topography includes a z-height of the chip; and selectively applying a variable thickness adlayer of a film to an upper surface of the wafer, thereby resulting in the chip and the film having a combined thickness that varies by less than approximately 100 nm across the chip.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which:

FIG. 1A depicts a perspective view of a map showing an average topographic profile calculated across all of a chip, in accordance with an embodiment of the present invention.

FIG. 1B depicts a topographic signature chip-by-chip for a particular wafer, in accordance with an embodiment of the present invention.

FIGS. 4A and 4B depict the embodiments from FIG. 3A and FIG. 3B, respectively, having received a corrective deposition, in accordance with a first embodiment of the present invention.

Figure 2:
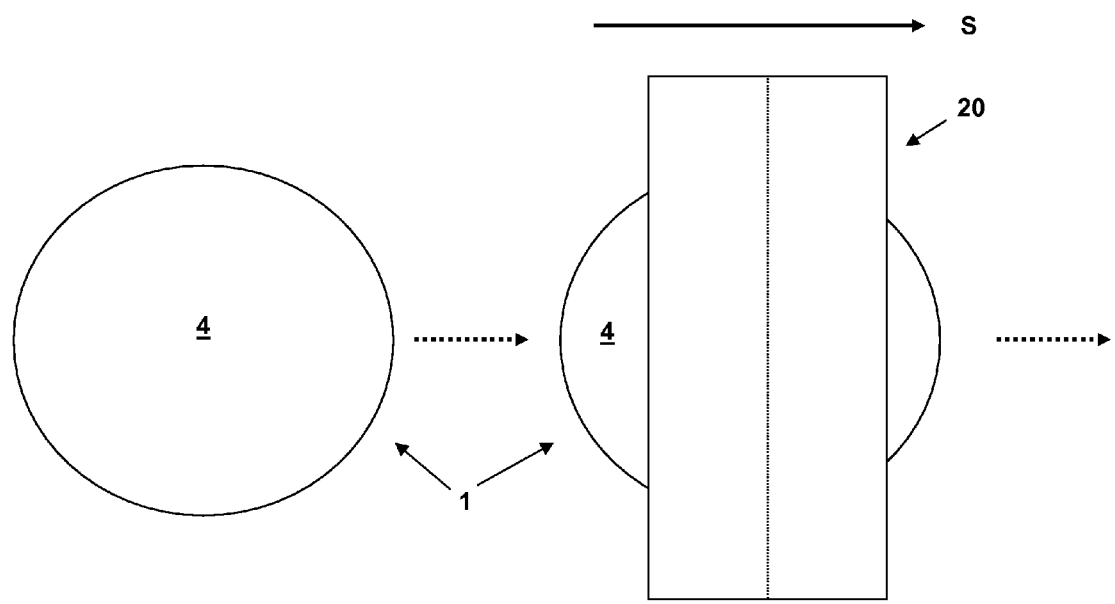
FIG. 2 depicts a top view of a wafer undergoing premapping and prescanning, in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

As indicated above, the present invention provides methods for topography compensated film application.

In an embodiment of the present invention, a wafer 1 (see e.g., FIG. 2) is first scanned to determine a z-height 7 (see e.g., FIGS. 3A, 3B) across an upper surface 4 of wafer 1. For example, this task of scanning and determining may include optically scanning using a scanner 20 (FIG. 2). Suitable scanners 20 include, for example, such as manufactured by ASML of Veldhoven, Netherlands. Alternatively, this may be performed in an offline tool using a variety of methods including modulating an optical grazing angle beam, or employing pressure sensors. The scanning step results in a determination of a topography of upper surface 4 of wafer 1, as the perspective view of a map (FIG. 1A) showing an average topographic profile calculated across all of an exemplary chip of wafer 1 by scanner. FIG. 1B depicts a top view, or topographic "signature", chip-by-chip for wafer 1 that has been optically scanned. In this manner, the across-wafer 1 topography may be rigorously and conveniently characterized prior to wafer 1 entering lithography module.

Prior to exposure, a topographic map is generated for wafer 1. There is no ability to correct for "within-chip" topographic step changes (i.e., topography) as seen in FIGS. 1A, 1B with current scanner 20 technologies because scanner can only perform linear tilt.

"Exposure" as used herein includes the process(es) wherein wafer 1 is exposed to radiation to image the photoresist while a scanner 20 is moving along wafer 1. While scanner 20 exposes, scanner 20 makes adjustments to stage (not shown) so as to minimize any focal plane variation over the "slice" of wafer 1 being exposed at any given instance. The aforementioned adjustments are based on the generated topographic map of wafer 1. Thus, in an embodiment, wafer 1 may be premapped by scanner 20, while the exposure of scanner 20 is off (e.g., this may be done on a separate stage); and, then the process is repeated, but with the laser radiation turned on, thereby applying corrections derived by premapping.

Figure 3A:
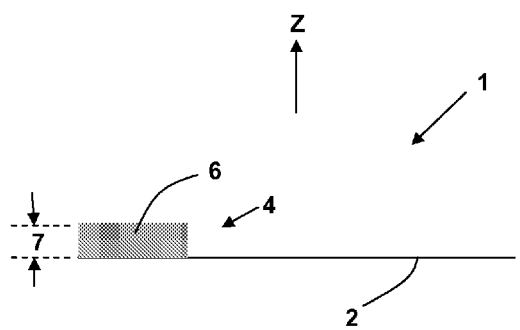
FIGS. 3A and 3B depict sectional, elevation views of incoming wafers, in accordance with embodiments of the present invention.
Figure 3B:
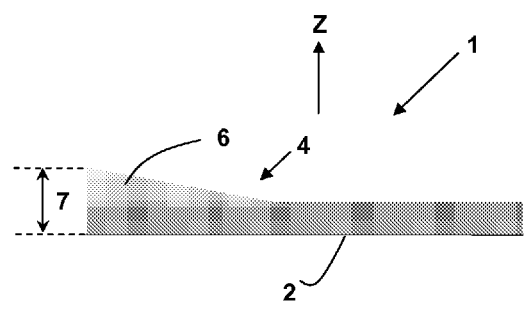

FIGS. 3A and 3B show two different embodiments of a wafer 1, in cross section, having an imperfect incoming topography. That is, upper surface 4 of wafer 1 is neither substantially planar, nor within a pre-determined distance 7 (in Z-direction) of substantially planar. As shown, wafer 1, in FIG. 3A, includes material 6 that is above a wafer plane 2 (e.g., a datum plane) and is not within pre-determined distance 7 (e.g., substantially parallel) wafer plane 2, with respect to z-direction, as denoted by arrow Z. Similarly, wafer 1, in FIG. 3B, is another embodiment having material 6 above a wafer plane 2 having wafer 1 topography that is not within pre-determined distance 7 (e.g., substantially parallel) of wafer plane 2. Wafers 1 have material 6 that is not planar, nor substantially planar. Note that the wafer 1 topography may be unplanar with respect to wafer plane 2 in either direction, be it in X or Y, or both X and Y directions (i.e., into and/or along page).

Referring to FIGS. 4A and 4B, in an embodiment, a variable thickness adlayer of film (hereinafter "adlayer film") 8 may be subsequently applied to wafer 1 prior to any resist patterning. In one embodiment, adlayer film 8 application may exploit "droplet on demand" ink-jet coating methods used in liquid crystal display (LCD) production that would allow rapid coating of wafer 1 with a variable polymer adlayer film 8 in a matrixed layout on wafer 1. There are several approaches to compensating for the topography of wafer 1. One embodiment is depicted in FIGS. 4A and 4B wherein adlayer film 8 is applied to wafer 1 so that variable depth of adlayer film 8 is modulated, and determined, based on local topography 4 of wafer 1. Adlayer film 8 is placed so that a resultant upper surface 3 is both planar and parallel to wafer plane 2, resulting in an elimination of any topographical variation in wafer 1. While conceptually more straightforward than other embodiments, this embodiment may require significant deposition of adlayer film 8 and has potential for more challenging process integration.

Figure 5A:
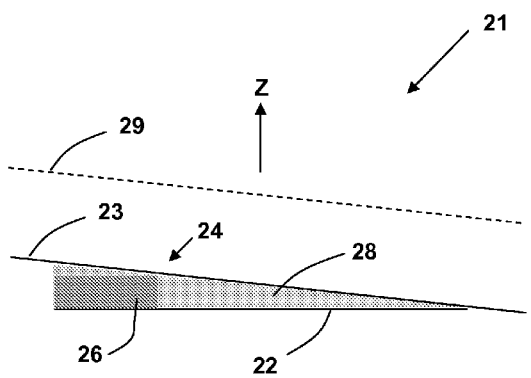
FIGS. 5A and 5B depict the embodiments from FIG. 3A and FIG. 3B, respectively, having received a corrective deposition, in accordance with a second embodiment of the present invention.
Figure 5B:
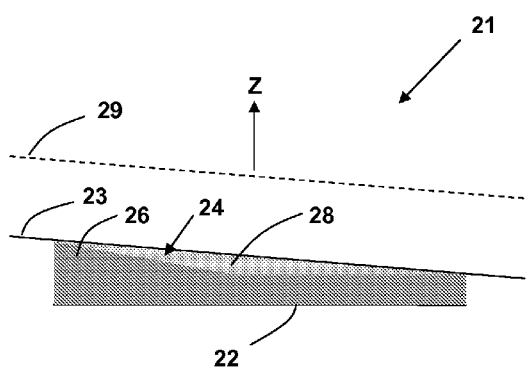

Another embodiment is depicted in FIGS. 5A and 5B, which recognizes that scanner 20 (FIG. 2) can apply a linear tilt correction between a wafer 21 and imaging plane 29. As such, after conducting aforementioned premapping step(s), optical linear focal plane 23 is calculated so as to minimize adlayer film 28 deposition. For example, in the embodiments in FIGS. 5A and 5B, optical linear focal planes 23 are found so that adlayer film 28 is thinner than if steps in the embodiments depicted in FIGS. 4A, 4B are completed. Thus, deposition of adlayer film 28 provides a planar imaging surface (i.e., focal plane 23) that is both planar and parallel with respect to imaging plane 29 with a linear tilt. Subsequent to deposition of adlayer film 28, wafer 21 is treated with appropriate reflectivity control and photoresist as in standard production patterning processes.

Figures 6A, 6B:
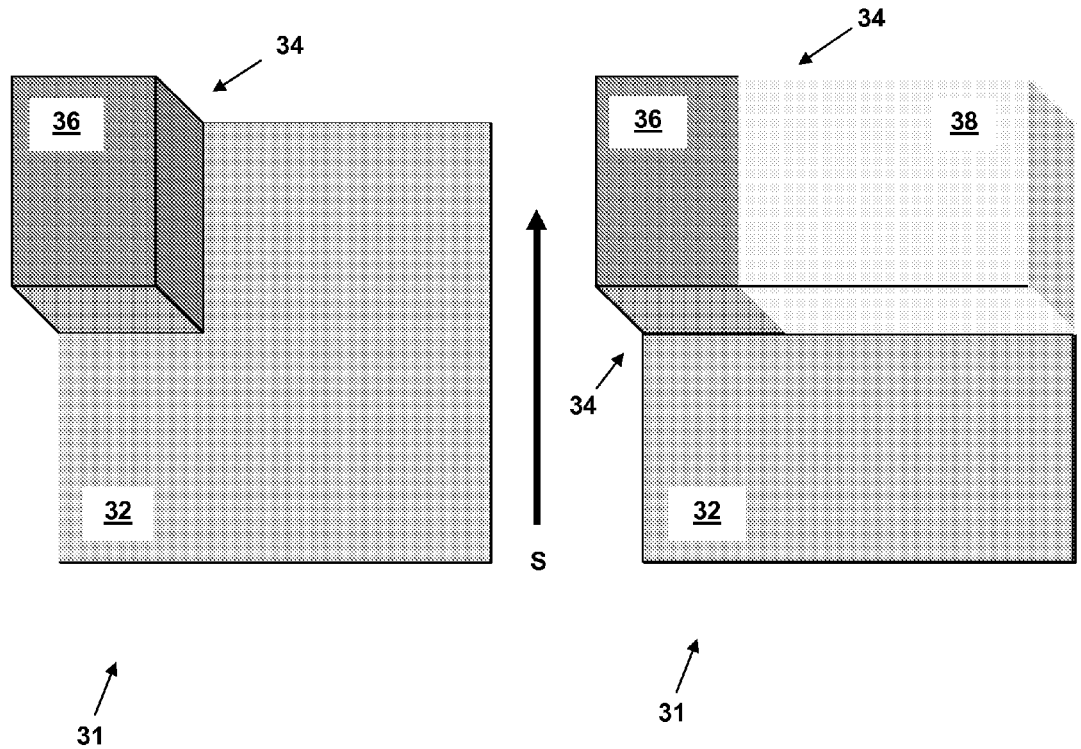
FIG. 6A depicts a top perspective view of another embodiment of an incoming wafer in accordance with the present invention.
FIG. 6B depicts a top perspective view of the embodiment in FIG. 6A having received a corrective deposition, in accordance with a third embodiment of the present invention.

An embodiment shown in FIGS. 6A and 6B, includes an adlayer film 38 that is deposited on a wafer 31 adjacent to a high portion 36 of wafer 31 that is not in a wafer plane 32, yet only in area that is in a direction that is across (i.e., normal to) the direction of scan by scanner 20 (FIG. 2), as shown by directional arrow S. In this embodiment, adlayer film 38 is only applied to parts of wafer 31 that are scanned concurrently with portion 36 of field 34 that is not in wafer plane 32. In this embodiment, the difficult step of correcting across slit step changes in direction Z is removed, leaving the step along the scan direction since the scanner 20 can dynamically adjust the focal plane as it scans the exposure field. In this embodiment, throughput and cost savings are realized by minimizing quantity of adlayer film 38 deposited on wafer 21 as compared to embodiment shown in FIGS. 4A and 4B.

The selective film deposition may be performed in a single pass to maximize throughput. Alternatively, film deposition may be done in multiple passes to either compensate for larger topographic differences and/or to provide finer granularity in the Z-height corrections with each successive pass. Parameters that may be used to control selective film deposition methods include nozzle diameter, coating material viscosity, temperature, shot velocity, and the like. Further, the grid size used to selectively deposit may be rather coarse as compared to device dimensions, thus achieving rapid throughput and avoiding the need for sophisticated deposition equipment.

Embodiments may address step height variation which occurs over areas greater than a 100 micron length scale. For example, a 100×100 micron pixilation is anticipated to be adequate for across-chip planarization while maximizing throughput.

Adlayer film 8, 28, 38 may be any suitable polymer, interlayer dielectric, anti-reflective underlayer, or photoresist applied so as to planarize surface of wafer 1, 21, 31. It is recognized that subsequent overetch steps may be appropriately modified (e.g. via feed-forward control) to account for the maximum deposited interlayer dielectric thickness or bottom antireflective coating (BARC) thickness. Clearly, said modifications may requisitely vary from wafer-to-wafer.

Further, premapping and adlayer film 8, 28, 38 application steps may be introduced at each back end of line (BEOL) step to combat the cumulative degradation of topography through many steps caused by conventional processes. By doing so, for example the thickness variation at each step may be reduced, thereby reducing the need to significantly modify overetch parameters.

Following film application step(s) and requisite curing, wafer 1 may be routed to a conventional track application step. The selectively deposited material (i.e., adlayer film 8, 28, 38) may now be overcoated with a spin-cast application of same, or similar, material. This step assists in ensuring optimal surface uniformity and local planarization before subsequent processing.

Advantages of these methods include that the process cost is minimized since the first film application may be conducted in a simple mapping/coating tool that is separated from a lithography tool cluster (i.e., deintegrated flow). If the deintegrated flow is used (i.e., method is performed on a stand-alone tool), there is no throughput impact to the high cost lithography cluster. Additional steps of a process take time, thereby impacting overall throughput. Thus, it may be undesirable to add the steps of the method to an existing scanner track tool cluster, because the cluster is complex and expensive and tying it up with additional process steps that can be run on a separate tool. The planarization into scanner 20 may be improved substantially, resulting in improved across-chip process latitude in the presence of topography, easily justifying the cost of an offline planarization process.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method of applying topographically compensated film, comprising:
   premapping a surface of a wafer, wherein a local topography of an upper surface of the wafer is determined; and
   applying a variable depth of an adlayer film to the wafer, wherein the variable depth is modulated based on the determined local topography, further wherein an upper surface of the applied adlayer film does not exceed a highest portion of the upper surface of the determined local topography.

2. The method of claim 1, wherein the applying further comprises: spin-casting the wafer thereby planarizing an upper surface of the adlayer film.

3. The method of claim 1, wherein the premapping step further comprises optically scanning the surface, wherein a z-height of the wafer is determined.

4. The method of claim 1, wherein the premapping step is conducted by one of an optical grazing angle beam and a pressure sensor.

5. The method of claim 1, further comprising:
   applying resist to the wafer; and
   patterning the resist on the wafer.

6. The method of claim 1, wherein the adlayer film is one selected from the group consisting of: a polymer, an interlayer dielectric, an anti-reflective underlayer, and a photoresist.

7. A method comprising:
   determining a topography of an upper surface of a semiconductor wafer; and
   applying with a droplet on demand ink-jet coating apparatus an adlayer film having a variable thickness to the upper surface of the wafer, wherein the variable thickness is based upon the determined topography, so that a resultant topography of the film on the wafer is substantially planar and substantially parallel to a tilted imaging plane of a scanner.

8. The method of claim 7, wherein the determining step is performed by a scanner.

9. The method of claim 7, wherein the resultant topography varies by less than approximately 100 nm.

10. The method of claim 7, wherein the determining step includes optically scanning the upper surface.

11. The method of claim 7, wherein the determining step includes determining a z-height of the wafer.

12. The method of claim 7, wherein the applying step includes spin-casting the wafer.

13. The method of claim 7, further comprising:
    applying resist to the wafer; and
    patterning the resist on the wafer.

14. The method of claim 7, wherein the adlayer film includes a polymer.

15. A method comprising:
    providing a wafer configured for semiconductor fabrication;
    determining a topography of an upper surface of a chip within the wafer with a scanner, wherein the topography includes a z-height and a high portion of the chip; and
    selectively applying, based on the determined topography, a variable thickness of an adlayer film to the upper surface of the wafer wherein the adlayer film is applied only adjacent the high portion in a direction that is normal to a direction of scanning by the scanner, prior to applying resist to the wafer, thereby resulting in the chip and the film having a combined thickness that varies by less than approximately 100 nm across the chip.

* * * * *